(12) United States Patent
Gaborieau et al.

(10) Patent No.: US 12,740,435 B2
(45) Date of Patent: Sep. 15, 2026

(54) METHOD OF MANUFACTURING AN INTERPOSER PRODUCT

(71) Applicant: Murata Manufacturing Co., Ltd., Nagaokakyo (JP)

(72) Inventors: Sophie Gaborieau, Ste Honorine du Fay (FR); Dominique Yon, Saint Aubin sur Mer (FR); Mickael Pommier, Caen (FR)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 626 days.

(21) Appl. No.: 18/320,460

(22) Filed: May 19, 2023

(65) Prior Publication Data

US 2023/0290649 A1 Sep. 14, 2023

Related U.S. Application Data

(63) Continuation of application No. PCT/IB2021/060752, filed on Nov. 19, 2021.

(30) Foreign Application Priority Data

Nov. 19, 2020 (EP) .................................... 20306409

(51) Int. Cl.
*H10W 74/01* (2026.01)
*H10W 70/04* (2026.01)
(Continued)

(52) U.S. Cl.
CPC ....... *H10W 70/041* (2026.01); *H10W 70/048* (2026.01); *H10W 72/071* (2026.01);
(Continued)

(58) Field of Classification Search
None
See application file for complete search history.

(56) References Cited

U.S. PATENT DOCUMENTS 6,214,646 B1 4/2001 Baron
2005/0212140 A1* 9/2005 Fujinaga ................. H01L 24/29 257/772

(Continued)

FOREIGN PATENT DOCUMENTS

CN 106298719 A 1/2017
EP 0622837 A1 11/1994

OTHER PUBLICATIONS

International Search Report issued for PCT/IB2021/060752, date of mailing Feb. 28, 2022.

*Primary Examiner* — Jay C Chang
(74) *Attorney, Agent, or Firm* — ArentFox Schiff LLP

(57) ABSTRACT

A method of manufacturing an interposer product that includes: forming on a same side of an interposer substrate, by a common process, first and second portions of a gold layer, wherein the first portion of the gold layer constitutes a wire-bonding pad; depositing a Au—Sn solder on the second portion of the gold layer, the Au—Sn solder comprising a gold-tin alloy having a first composition; merging the deposited Au—Sn solder with the second portion of the gold layer by performing a reflow process to form at least one bonding bump, wherein a majority of the bonding bump is made of a eutectic composition of the gold-tin alloy, and wherein the first composition has a smaller proportion of gold than is in the eutectic composition of the gold-tin alloy; and planarizing the bonding bump to form a flat bonding bump having a selected height.

11 Claims, 5 Drawing Sheets

(51) Int. Cl.
*H10W 72/00* (2026.01)
*H10W 72/30* (2026.01)

(52) U.S. Cl.
CPC .... *H10W 74/014* (2026.01); *H10W 72/01271* (2026.01); *H10W 72/07211* (2026.01); *H10W 72/07234* (2026.01); *H10W 72/30* (2026.01)

(56) References Cited

U.S. PATENT DOCUMENTS

2009/0095513 A1* 4/2009 Oshika .................... H01L 24/29
228/208
2010/0309641 A1 12/2010 Hata et al.
2013/0307154 A1 11/2013 Zolfagharkhani et al.

* cited by examiner

- Deposit adhesion / barrier layer — S100
- Deposit seed layer — S101
- Deposit Au layer — S102
- Deposit Au-Sn solder bump on bump-bonding electrode — S103
- Reflow — S104
- Planarize bonding bump — S105

7
6a
6b
5a
5b
4a
4b
2
3a
3b 6a
8
5a
4a
4b
2
3a
3b 8
6a
5a
4a
4b
2
3a
3b 30
29
28
23
24
25
26
27
9/14
4b
3b
20
21
4a
5a
12
3a
22

METHOD OF MANUFACTURING AN INTERPOSER PRODUCT

CROSS REFERENCE TO RELATED APPLICATIONS

The present application is a continuation of International application No. PCT/IB2021/060752, filed Nov. 19, 2021, which claims priority to European Patent Application No. 20306409.2, filed Nov. 19, 2020, the entire contents of each of which are incorporated herein by reference.

FIELD OF THE INVENTION

The present invention relates to the field of integration and, more particularly, to a method of manufacturing an interposer product.

TECHNICAL BACKGROUND

As part of the ongoing effort to miniaturize electronic components and systems, interposers are often used in so-called 2.5D packaging of integrated circuit dies and the like. In some applications it is desired to provide, on the same side of the interposer, both wire-bonding electrodes (pads) and a bump-bonding electrode bearing a bonding bump, so that components can be electrically connected to the interposer using wire-bonding and bump bonding (e.g. flip-chip type bonding), respectively.

For instance, some photonics modules employ an interposer which has (a) an optical component, such as a laser diode, connected by bump-bonding to one or more bonding-bumps provided on bump-bonding electrodes on the interposer and (b) discrete electronic components that are wire-bonded to one or more wire-bonding electrodes on the interposer. An example of a photonics module PM of this type is illustrated in FIG. 1. The photonic module has an interposer, I, upon which are mounted various discrete components (resistors, capacitors, etc.) as well as a laser diode, LD. The laser diode, LD, is mounted on a flat bonding bump (not shown) made of eutectic Au—Sn, following performance of a bump bonding process. Wire-bonding electrodes, WBE, are provided on the same surface of the interposer, I, as the flat bonding bump and bonding wires, BW, connect one or more of the discrete components to the wire-bonding electrodes, WBE. Typically, the interposer, I, is made of ceramic AlN.

As another example, some microelectronics systems mount a stack of dies on an interposer, with the lowest die in the stack being bump-bonded to a set of bump-bonding electrodes on the interposer and with wire bonds from dies higher up the stack extending to wire-bonding electrodes on the interposer (see, for example, US 2010/0309641).

Bump-bonding generally involves use of solder whereas wire-bonding generally uses wires made of gold or other metals. Accordingly, in view of optimizing the electrical connections using these different types of material, the characteristics of the wire-bonding electrodes that are provided on the interposer are often different from the characteristics of the bump-bonding electrodes that are provided on the interposer.

Various methods have been proposed for forming wire-bonding electrodes, bump-bonding electrodes and bonding bumps on the same surface of an interposer.

For example, US 2010/0309641 describes a first method in which a Cu layer is electroplated on a patterned Cu seed layer to form bump-bonding electrodes and, simultaneously, to form the lower layers of wire-bonding electrodes. The bump-bonding electrodes are then shielded by a protective layer while additional Ni and Au layers are plated onto the wire-bonding electrodes. Solder bumps made of tin-silver-based lead-free solder are formed on the bump-bonding electrodes by printing on solder paste, or by applying solvent to the bump-bonding electrode before deposition of solder powder (in both cases, followed by heating and cleaning steps). However, this first method involves numerous steps and the surface of the bump-bonding electrodes tends to oxidize, leading to a need for cleaning before a solder bump can be formed thereon.

US 2010/0309641 discusses a hypothetical second method that could be contemplated in order to reduce the overall number of process steps involved in manufacturing the wire-bonding electrodes and bump-bonding electrodes on the interposer. According to this hypothetical second method, all of the electrodes would be made by plating an Au layer onto a Ni layer, and solder bumps would be formed on the bump-bonding electrodes. However, US 2010/0309641 teaches that if the Ni and Au layers are made to the thickness that would be optimal for the wire bonding electrodes this would cause various problems in relation to the bump-bonding electrodes and, notably, would interfere with the ability to form solder bumps on the bump-bonding electrodes.

So, US 2010/0309641 proposes a third method to form bump-bonding electrodes and, simultaneously, to form wire-bonding electrodes on an interposer. In this third method, a Cu layer is electroplated onto a patterned Cu seed layer, then a Ni layer is deposited on the Cu layer so as not to coat the sides of the Cu layer, then a thin Au layer is formed over the Ni—Cu stack so as to coat the whole stack surface including the sides). The resulting electrodes serve as wire-bonding electrodes and bump-bonding electrodes, with the different types of electrodes being differentiated from one another by their width and spacing. A special metal-jet technique is then used to create solder bumps on the bump-bonding electrodes.

Although the third method proposed in US 2010/0309641 has a relatively low number of process steps, notably because it uses a common set of process steps to create the wire-bonding electrodes and the bump-bonding electrodes, the materials and layer-thicknesses used in the bump-bonding electrodes are the same as those used in the wire-bonding electrodes, which means that compromises are made and the characteristics are not optimal for the bump-bonding electrodes and/or not optimal for the wire-bonding electrodes. Moreover, the formation of the solder bumps requires use of a non-standard metal-jet technique.

Furthermore, different processes—such as vapor deposition processes, electroplating, sputtering, preform deposition, etc.—may be used to deposit on the interposer surface the layers that will make up wire-bonding electrodes, bump-bonding electrodes and bonding bumps. In various applications, for example those where high temperatures may be encountered and/or where high reliability is important, it is desirable to use Au—Sn solder bumps for mounting components on an interposer by bump bonding, for example in view of assuring good thermal conductivity through the bond. However, contact-resistance problems can arise in the case of using vapor deposition to form layers of a bump-bonding electrode before an Au—Sn solder bump is applied to the electrode. The other techniques generally require a large number of front-end steps, and involve processes that are complicated to put into place.

The present invention has been made in the light of the above problems.

SUMMARY OF THE INVENTION

The present invention provides a method of manufacturing an interposer that comprises forming at least one wire-bonding pad and at least one bonding bump all on the same side of a substrate of the interposer product characterized in that the forming of the at least one wire-bonding pad and at least one bonding bump comprises: forming on said same side of the interposer substrate, by a common process, first and second portions of a first gold layer, wherein the first portion of the first gold layer constitutes a wire-bonding pad; depositing Au—Sn solder on the second portion of the first gold layer, the Au—Sn solder comprising gold-tin alloy having a first composition, wherein said first composition comprises a smaller proportion of gold than is in the eutectic composition of gold-tin alloy; merging the deposited Au—Sn solder with the second portion of the first gold layer by performing a reflow process to form said at least one bonding bump, wherein the majority of the bonding bump is made of gold-tin alloy having the eutectic composition of gold-tin alloy; and planarizing the bonding bump to form a flat bonding bump having a target height.

The above interposer-product manufacturing method may provide various advantages. The overall number of process steps is small, which reduces the time and cost involved in the manufacturing process. The consumption of chemicals is reduced, leading to less harm to the environment. Moreover, it is easy to adjust the composition of the bonding bump, notably in terms of the gold content of the Au—Sn alloy, by control of the first composition in the Au—Sn solder.

The above-described interposer-product manufacturing method includes a process of planarizing the bonding bump to form a flat bonding bump having a target eight. In many applications it is desirable to adjust the height position of the top surface of the bonding bump, notably in cases where it is desired to control with precision the position/alignment of the component to be mounted on the bonding bump. In the case where the above-described interposer-product manufacturing method is employed to manufacture an optical interposer, even after reducing the height of the bonding bump the composition of the bump is at or near the eutectic composition, enabling high-quality bonds to be formed. The step of planarizing the bonding bump may include setting the height of the flat bonding bump dependent upon a target height above said interposer substrate of an optical component (e.g. a laser diode) to be bonded to the bonding bump. This facilitates optical alignment of the laser diode.

In the above-described interposer-product manufacturing methods, the depositing of Au—Sn solder may deposit Au—Sn solder paste comprising gold-tin alloy in a chemical flux. In such a case, during the reflow process the flux removes an undesired oxidation layer that may form, for example, on the tin in the solder paste and which might otherwise cause the contact-resistance problems mentioned above and reduce the ability of the solder to wet the underlying structure. In the latter interposer-product manufacturing method, the Au—Sn solder paste may be deposited by serigraphy (screen printing). In such a case, it is possible to deposit layers of solder paste that are relatively thick.

The above-described interposer-product manufacturing methods may include a process of forming, on the surface of the interposer substrate, adhesion layer portions upon which the first and second portions of the first gold layer are formed afterwards. The adhesion layer may have a function of improving adhesion of the first gold layer portions to the underlying interposer-substrate structure. The adhesion layer may have a barrier function, impeding diffusion of the overlying first gold layer into the underlying interposer-substrate structure. The adhesion/barrier layer portions may be made of TiW in view of the low diffusivity of gold atoms in tungsten.

The above-described interposer-product manufacturing methods may include a process of forming a seed layer on a surface of the adhesion/barrier layer portions.

In the above-described interposer-product manufacturing methods the interposer substrate may be a semiconductor substrate made of silicon or the like. Techniques for processing structures in and on silicon substrates are well-developed and highly accurate, moreover electronic components may be integrated into the substrate. A batch of interposer products may be made simultaneously on a substrate constituted by a silicon wafer, and the manufacturing method then comprises a wafer thinning to the right thickness and a singulation process to separate the individual interposer products. This batch processing improves manufacturing yield.

BRIEF DESCRIPTION OF THE DRAWINGS

Further features and advantages of the present invention will become apparent from the following description of certain embodiments thereof, given by way of illustration only, not limitation, with reference to the accompanying drawings in which.

DETAILED DESCRIPTION OF EXAMPLE EMBODIMENTS

Embodiments of the present invention provide interposer products comprising: at least one wire-bonding electrode, and at least one bonding bump. Principles of the present invention will become clear from the following description of an example embodiment in which the component to be bump-bonded to the bonding-bump of the interposer product is a laser diode, but the skilled person will readily understand that the same principles may be applied for interposer products upon which components other than laser diodes are to be bump-bonded.

Figures 1, 2:
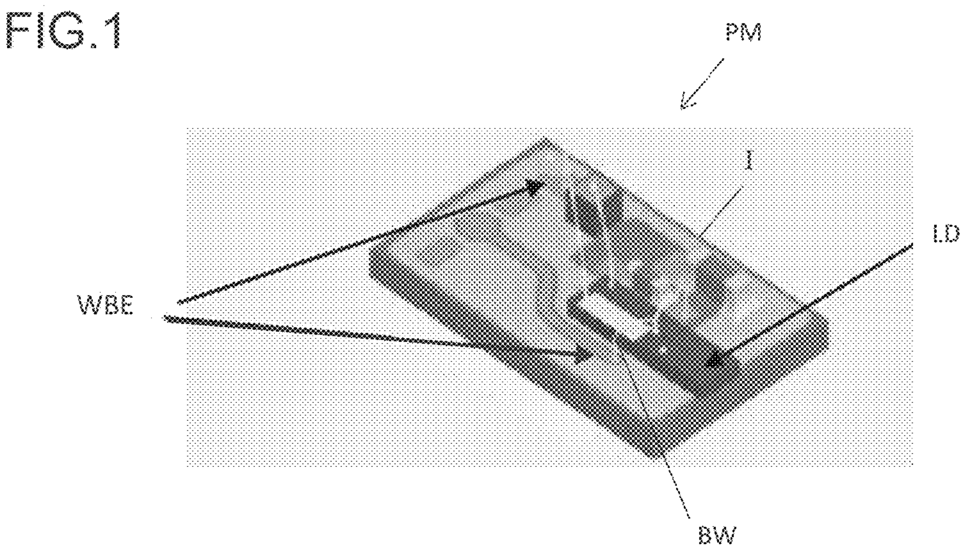
FIG. 1 is a perspective view of an example of a photonics module including an interposer having on its surface both wire-bonding electrodes and a bonding bump.
FIG. 2 is a flow diagram illustrating a method of manufacturing an interposer product according to an embodiment of the invention.

A first embodiment of a method of manufacturing an interposer product, in accordance with the present invention, will now be described with reference to FIGS. 2 and 3A-3G. FIG. 2 is a flow diagram illustrating a manufacturing method according to an embodiment of the invention which produces an interposer product 10. FIGS. 3A-3G are diagrams to illustrate stages in the manufacturing method of FIG. 2.

Figure 3A:
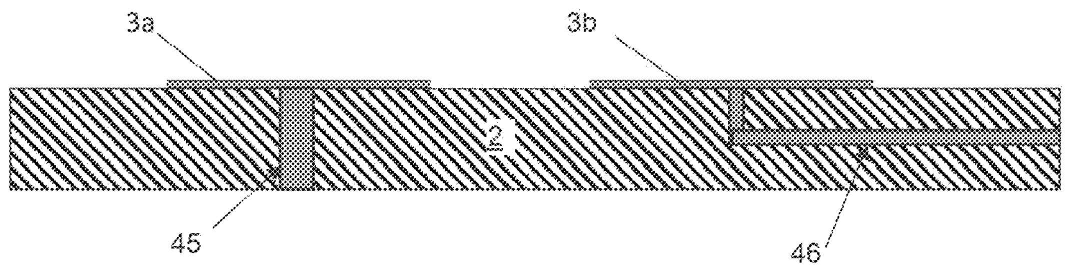
FIGS. 3A-3G are diagrams to illustrate respective stages in the manufacturing method of FIG. 2.

The method according to the present embodiment forms at least one wire-bonding electrode (pad), and at least one bonding bump on a substrate. Typically, the substrate incorporates conductors to interconnect the components that will be mounted on the interposer product to one another and/or to a mounting board upon which the interposer will be mounted. An example substrate 2 is illustrated in FIG. 3A. In this example, metal pads 3*a*, 3*b* are provided on a major surface of the substrate and the pad 3*a* is connected to a via-hole conductor 45 that traverses the substrate 2 in its thickness direction whereas the pad 3*b* is connected to a conductor 46 for performing electrical connection in the lateral direction. The conductors 45, 46 illustrated in FIG. 3A are but one example of a possible configuration of the interposer substrate, and it will be understood that the invention is not limited in regard to the number and geometry of the conductors in or on the substrate. For simplicity, in FIGS. 3B-3G the substrate 2 is illustrated without any conductors incorporated therein.

FIG. 3A illustrates two pads 3*a*, 3*b*: the left-hand pad in the drawing, 3*a*, is the site for a wire-bonding electrode and the right-hand pad in the drawings, 3*b*, is the site for a bonding bump. Of course, two, three or more than three bonding bumps may be provided, depending on the intended application of the interposer product. In a similar way, two, three, or more than three wire-bonding electrodes may be provided, depending on the intended application of the interposer product. Similarly, the geometric layout of the wire-bonding electrode(s) and bonding bump(s) is designed in view of the intended application. The pads 3*a*, 3*b* may be made of any convenient conductive material: aluminum, or alloys in which Al is a main component (e.g. with small quantities of Si and/or Cu), are preferred to Cu pads in view of the pollution problems associated with use of Cu. In this example Al is used to form the pads 3*a*, 3*b*. A typical value for the thickness of such Al pads is 3 μm.

The substrate 2 may be made of various materials. One example material is aluminum nitride (AlN), or other ceramics materials. Other examples include semiconductor materials, such as silicon. Electronic components may easily be integrated into a substrate made of Si or another semiconductor. In the present example the substrate is made of silicon. A plurality of interposer products may be made as a batch in a common silicon wafer by employing a method according to the invention and then the formed interposer products may be singulated later on by known processes (e.g. scribing, dicing).

Figure 3B:
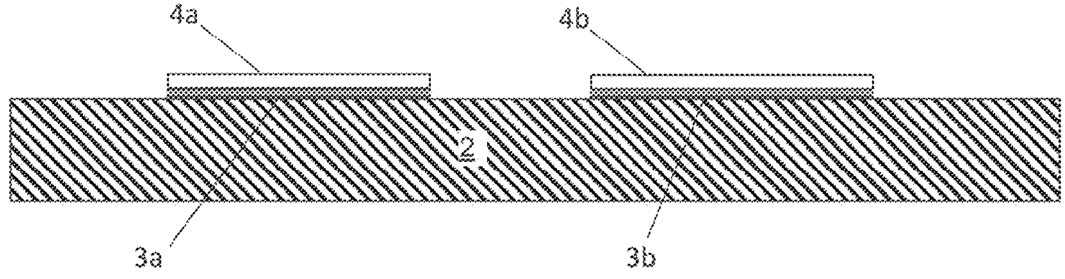

Gold layers are deposited in the method according to the present invention. The method of FIG. 2 may include a preliminary step S100 to form adhesion/barrier layer portions 4*a*, 4*b* on the metal pads 3*a*, 3*b* where gold layers of the wire-bonding electrode and bonding bump are to be formed, as illustrated in FIG. 3B. Such an adhesion layer may be provided, for example, in view of creating a barrier to diffusion of gold into the underlying substrate (notably because diffused gold could change the doping in the case where the substrate 2 is a semiconductor). The adhesion/barrier layer may be made, for example, of Ni or TiW. TiW is used in the present embodiment, which enables the thickness of the adhesion/barrier layer to be kept low. A typical value for the thickness of a TiW adhesion/barrier layer is 0.3 μm. Any convenient process or set of processes may be used in step S100 to form the adhesion/barrier layer portions 4*a*, 4*b*, notably depending on the material used to form the adhesion layer. For instance, the adhesion/barrier layer portions 4*a*, 4*b* may be formed by sputtering, evaporation, etc. A common process (or set of processes) serves to form the adhesion/barrier layer portions 4*a*, 4*b* on the pads where the wire-bonding electrode and bonding bump are to be formed. In this example the TiW adhesion/barrier layer portions are deposited by sputtering, enabling precise control of the layer thickness.

Figure 3C:
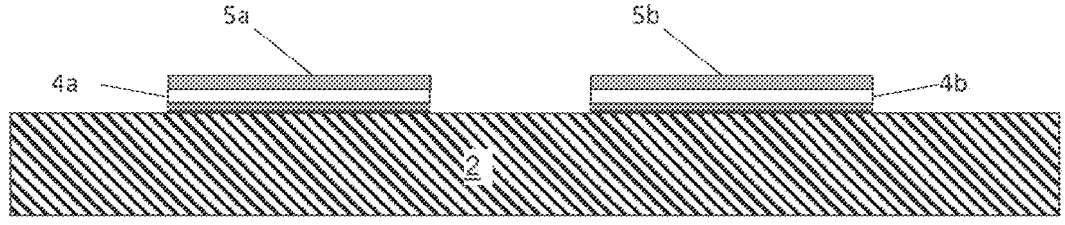

The method of FIG. 2 may include a further preliminary step S101 to form seed layer portions 5*a*, 5*b* on the adhesion/barrier layer portions 4*a*, 4*b*, as illustrated in FIG. 3C. In this example, in a common process S101, a gold layer to serve as the seed layer is formed on the adhesion/barrier layer portions where the wire-bonding electrode and bonding bump are to be formed. The respective Au seed layer portions are labelled 5*a*, 5*b* in FIG. 3C and subsequent figures. Typically, the Au seed layer is thin, for example having a thickness of the order of 800 A in this example. Any convenient process or set of processes may be used in step S101 to deposit the portions 5*a*, 5*b* of the seed layer: for instance, the gold seed layer portions 5*a*, 5*b* may be formed by sputtering, etc.

Figure 3D:
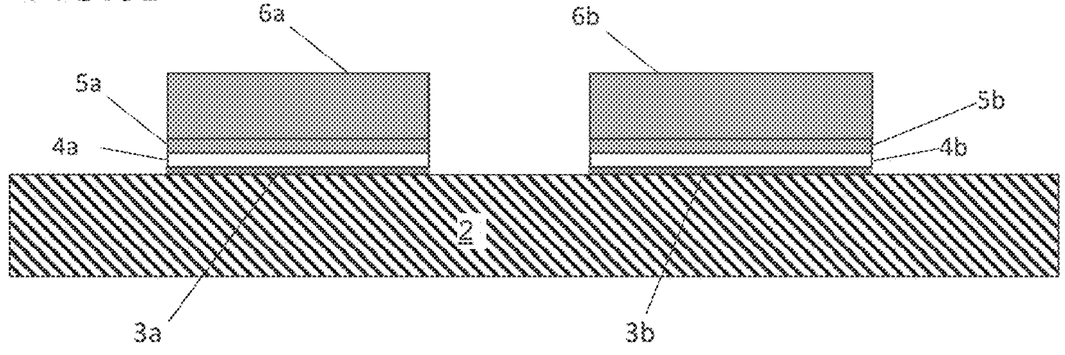

In a common process S103 of the method of FIG. 2, a gold layer 6 is formed at the locations where the wire-bonding pad and bonding bump are to be provided, as illustrated in FIG. 3D. More specifically, a first portion 6*a* of the gold layer is formed at a location where a wire-bonding pad is required and a second portion 6*b* of the gold layer is formed at a location where a bonding-bump is required. Typically, the Au layer is thick, notably of the order of 3 μm±1.5 μm, in view of the functional requirements of the wire-bonding pad. Any convenient process or set of processes may be used in step S103 to deposit the gold layer 6, for example, an electroplating process may be used. In a preferred embodiment of the invention, in step S103 a thick gold layer is plated on underlying TiWAu. After the deposition of the gold layer, the first portion 6*a* may serve as a wire-bonding pad.

Figure 3E:
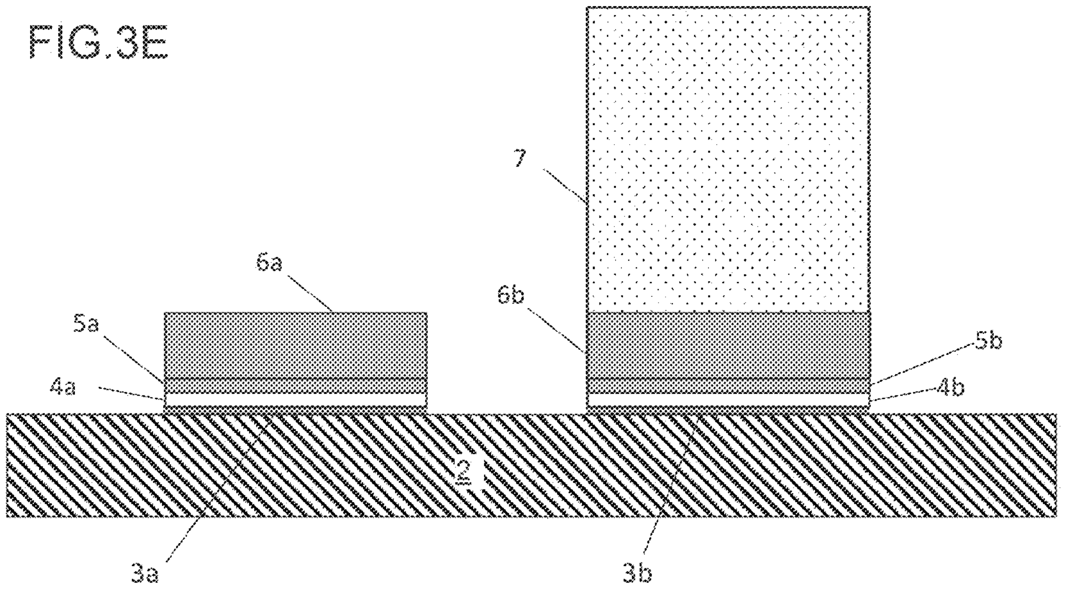
Figure 3F:
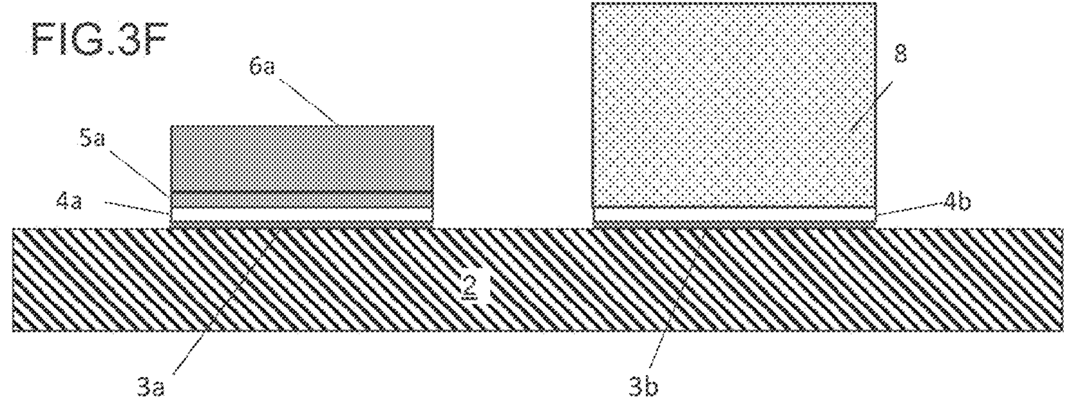
Figure 3G:
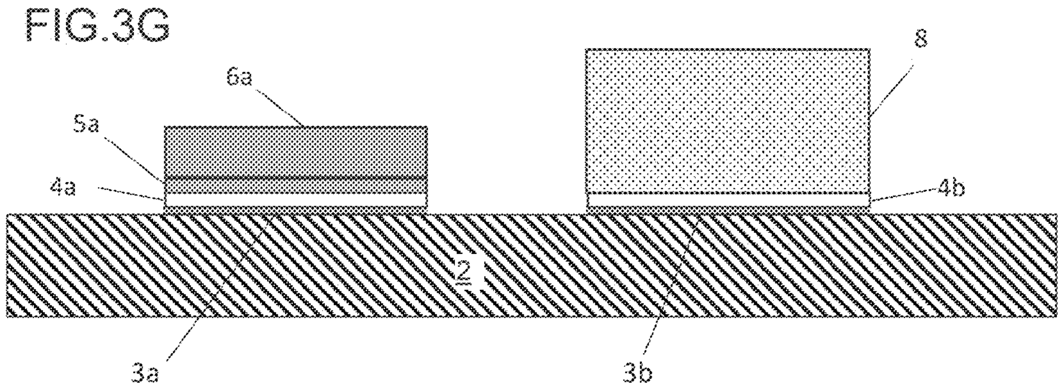

In step S104 of the method of FIG. 2, Au—Sn solder 7 is deposited on the second portion 6*b* of the gold layer, as illustrated by FIG. 3E. In this example, the process S104 deposits Au—Sn solder paste that comprises Au—Sn alloy dispersed in a chemical flux vehicle. The flux may be any convenient material, for example: a rosin-based flux, a low-solid/no-clean flux, or a water-soluble flux. In a typical embodiment, the solder paste contains 50% flux and 50% Au—Sn alloy particles by volume. It has been found that deposition of the Au—Sn solder in the form of a paste containing flux mitigates the contact resistance problem encountered in previously-proposed processes. In this example a water-soluble flux is used, which enables particles and/or leftover flux to be removed easily at the end of the solder-deposition process.

Any convenient process or set of processes may be used in step S104 to deposit the Au—Sn solder paste 7. In certain implementations of the invention a screen-printing process may be employed in view of the precise placement and substantial layer thickness that is achievable using screen-printing. In particular, the substrate is overlain by a screen-printing stencil (not shown) having one or more openings defining locations where solder bumps are required. Au—Sn solder paste is applied over the stencil, e.g. by drawing an angled squeegee across the surface of the stencil, and enters the openings to form a deposited layer of Au—Sn solder 7. The stencil thickness and opening dimensions are selected to deposit a target volume of solder paste for each bonding bump, having regard to the volume of the gold portion 6*b* upon which the bonding bump is being deposited and the targeted final composition.

In principle, the length and width of the opening in the stencil can be set to match the length and width of the second portion 6*b* of the gold layer upon which the solder paste is to be deposited and the stencil thickness may then be set to produce a deposited volume of solder paste that will produce the target composition of the bonding bump after reflow. However, to simplify manufacture and reduce costs it may be more convenient to make use of a stencil having one of the industry-standard thickness values and to adjust the width and length of the opening formed in this standard-thickness stencil in view of the volume of solder paste it is desired to deposit. In such a case, due to the wettability of the solder paste, it spreads after application to cover the underlying bonding electrode.

In bump-bonding processes employing Au—Sn bonding bumps, the composition of the Au—Sn alloy that gives best soldering performance is generally the eutectic composition, namely 80% Au and 20% Sn by weight, written AuSn80/20. For example, gold-tin eutectic bonding can be performed at lower temperature and pressure than gold-gold thermocompression bonding. However, experiments conducted by the present inventors have shown that problems can arise in the case where the layer of Au—Sn solder which is deposited on the bump-bonding pad contains an Au—Sn alloy composition that corresponds to the eutectic composition.

In a first set of experiments, solder paste containing eutectic Au—Sn alloy (i.e. Au—Sn80/20) was deposited on NiAu bump-bonding pads in which the thickness of the Au portion was roughly 100 nm and the thickness of the Ni portion was 5 μm±2 μm, reflow was performed, then planarization, to produce flat bumps of thickness 8 μm or of thickness 17 μm. The resultant bumps had regions with different Au—Sn compositions.

In a second set of experiments, solder paste containing eutectic Au—Sn alloy, or solder paste containing Au—Sn alloy having 77% Au and 23% Sn by weight (i.e. Au—Sn77/23), was deposited on TiWAu bump-bonding pads. In both cases reflow was performed, then planarization, to produce flat bumps of thickness 8 μm or of thickness 17 μm. The thickness of the Au layer in the TiWAu bump-bonding pads was approximately 3 μm.

Comparing the results of the first and second sets of experiments, it was found that, for a given height of the bonding bumps, the average composition of the bumps at the bump surface departed the most from the eutectic Au—Sn composition in the case where eutectic Au—Sn was deposited on NiAu. Indeed, for the 8 μm bonding bumps produced by deposition of eutectic Au—Sn on NiAu, the average gold-tin composition at the bump surface departed significantly from the desired eutectic composition and was close to Au—Sn77.9/22.1 (i.e. significantly deficient in gold). This would lead to inferior soldering performance when bonding a component to the bonding bump.

The bonding bumps produced in the second set of experiments likewise had regions with different Au—Sn compositions, notably some regions of composition Au—Sn80/20 but a gold-rich phase elsewhere which has a liquidus point at higher temperature. However, the average composition of the bumps at the bump surface was closer to the eutectic composition than for the bumps produced in the first set of experiments that had used NiAu bump-bonding pads rather than TiWAu bump-bonding pads. It was notable that, for a given height of bonding bump, in the second experiments the average composition of the bonding bumps, at the bump surface, was closest to the eutectic composition in the case where the deposited solder paste contained Au—Sn77/23.

Figure 4A:
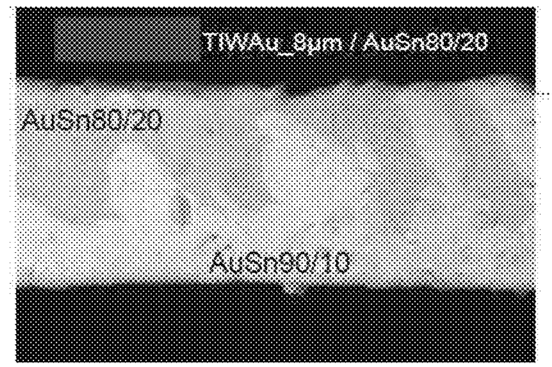
FIGS. 4A-4D are images of cross-sections through bonding bumps made in a set of experiments.

FIG. 4A is a cross-sectional view through a bonding bump of height 8 μm produced in the second set of experiments in a case where the deposited solder paste contained eutectic Au—Sn alloy (Au—Sn80/20).

Figure 4B:
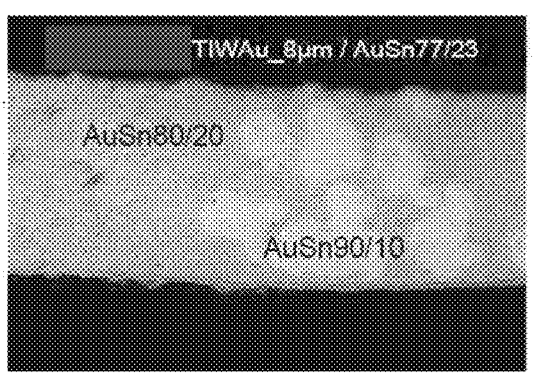

FIG. 4B is a cross-sectional view through a bonding bump of height 8 μm produced in the second set of experiments in a case where the deposited solder paste contained Au—Sn77/23 alloy.

Figure 4C:
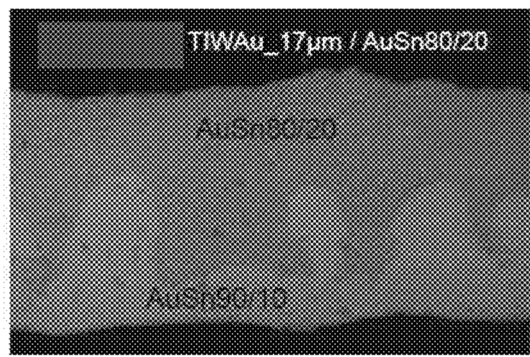

FIG. 4C is a cross-sectional view through a bonding bump of height 17 μm produced in the second set of experiments in a case where the deposited solder paste contained eutectic Au—Sn alloy.

Figure 4D:

FIG. 4D is a cross-sectional view through a bonding bump of height 17 μm produced in the second set of experiments in a case where the deposited solder paste contained Au—Sn77/23 alloy.

As can be seen from FIGS. 4A-4D, in the bonding bumps formed in the second experiments, in the case of using the solder paste containing the eutectic Au—Sn alloy there tended to be a concentration of the Au-rich phase at the bottom of the bump and extending to a significant height up the bump. This may cause problems in the case of using the bonding bump for mounting a laser diode or the like, because—for optical alignment purposes—the height of the bonding bump may be reduced and this could produce a case where the bump surface arrives in a zone which is majority Au-rich phase having a liquidus point at a significantly higher temperature than the eutectic composition. In such a case the reduced-height bonding bump would have a poorer shear strength and successful bump-bonding may prove impossible.

In contrast, although there are regions of Au-rich phase material in the bonding bumps formed in the case of using solder paste containing Au—Sn77/23, the Au-rich phase is not highly concentrated in the lower portion of the bump. Accordingly, even in cases where the bump height is reduced, e.g. down to 4 μm, the surface of the reduced-height bump still has a large concentration of eutectic Au—Sn, shear strength is maintained and successful bonding may still be performed.

Returning to the manufacturing method illustrated in FIGS. 2 and 3, the composition of the Au—Sn alloy in the solder that is deposited in step S103 has lower gold content than the target gold content of the final bonding bump. This is because gold will migrate from layers 5*b* and 6 into the deposited Au—Sn solder 7 during a subsequent reflow process (see below). The gold content of the Au—Sn alloy in the solder deposited in step S103 is selected based on the target composition for the final bonding bump and based on the relative volume of the gold layers 5*b*+6 on the one hand and the volume of the deposited Au—Sn solder 7 on the other hand.

In an example implementation of the present embodiment, the target composition of the final bonding bump is the eutectic composition, 80 wt. % Au and 20 wt. % Sn. Accordingly, in the case where the aggregate thickness of the layers 5*b*+6 is 3 μm±1.5 μm, and the Au—Sn solder paste layer 7 has a thickness of 56/2±3 μm (i.e. which may be considered to be approximately 28 μm given that after reflow the flux will have departed and the solder paste in this example is 50:50 Au—Sn to flux), the deposited solder paste comprises Au—Sn alloy having a composition including 77 wt. % Au and 23 wt. % Sn.

In step S104 of the method of FIG. 2, a reflow process is conducted and, as a result, the flux from the Au—Sn paste volatilizes and the gold from layers 5*b* and 6 migrates into the Au—Sn paste, producing a volume 8 of merged Au—Sn material having a substantially homogenous composition in which, globally, the gold content corresponds to the proportion targeted for the final bonding bump. The reflow process may be conducted by placing the substrate 2 bearing the stacked layers in an oven, or conveying the substrate through one or a series of ovens on a conveyer, heating to a peak temperature above liquidus, keeping the temperature above liquidus for a target time period (TAL), then cooling.

Characteristics of a reflow profile form part of the common general knowledge of the skilled person and, with the exception of the specific points noted below, will not be defined in detail here. Typical information about reflow profiles can be found at the website of Indium Corporation, e.g. in the series of blog posts starting at https://www.indium.com/blog/stages-of-a-reflow-profile-part-i.php To achieve excellent wetting and spread to form a high-quality solder joint it could be considered that the peak temperature should be 40-50° C. above liquidus, TAL should be 45-90 seconds and, in the heating phase from liquidus to peak temperature, a ramp rate of 2.5° C.-3.5° C. temperature increase per second should be applied. If the peak temperature and TAL are too high this can result in excessive formation of intermetallics which decrease the reliability of the solder joint. However, good results have been achieved in embodiments of the present invention using a peak temperature in the range 55° C. (±5° C.) above liquidus, e.g. 335° C.±5° C., and using a TAL duration of 60-70 seconds (e.g. 65 seconds). Moreover in the latter example, the ramp rate for temperature increase was approximately 1.9° C. per second from room temperature up to peak temperature.

In a case where the deposited Au—Sn solder includes a chemical flux vehicle, during the reflow process the chemical flux removes an oxidation layer that may form, for example, on the tin particles, solving the contact resistance problem mentioned above. Depending on the application, the structure 8 may constitute the final bonding bump 14.

In some applications it may be desired to form a flat bonding bump having a defined thickness. This may be the case, for example, for an interposer product intended for use in a photonics module where a laser diode is to be mounted on the bonding bump and the position of the laser diode is tightly controlled in view of optical alignment issues. The method of FIG. 2 includes an additional step S105 performed to planarize the structure 8 and produce a flat bonding bump 9. The planarization may be performed by any convenient process—for example grinding,—and the process is continued until the flat bonding bump reaches the defined thickness. In a case where the flat bonding bump 9 is intended for use in mounting a laser diode on the interposer product, it may be desirable to have a low thickness for the final flat bonding bump 14. Current fabrication methods produce an error margin of roughly ±4 μm for the height of the flat bonding bump 14 after planarization so the target low thickness may be of the order of 8 m. As fabrication methods improve even lower values may be set for the target thickness of the flat bonding bump 14, such as 6 μm or 5 μm (±2 μm or, preferably, ±1 μm).

The above-described method provides numerous advantages. The overall manufacturing method is simple and does not include many process steps, leading to time savings and cost reduction. It is easy to adjust the gold content in the final bonding bump because this can be done by changing the gold content in the Au—Sn solder that is applied during step S103. Fewer chemical products are consumed than in the more-complicated known processes and, bearing in mind that the chemicals employed can be detrimental to the environment, this produces a concomitant reduction in the environmental burden associated with the manufacturing process. The global composition of the bonding bumps can be made close to the eutectic composition. Within the bonding bumps, regions having a composition that departs from the target composition are not highly concentrated in the bottom portion of the bump, reducing the risk that reduction in bump height will being the bump surface into an Au-rich phase.

The height of the final bonding bump 9 is easily adjustable. In the case where a batch of interposer products are made on a common wafer, then the individual interposer products are obtained by singulation, it is convenient to adjust the thickness of the bonding bumps on the interposer products as a batch, by grinding or polishing before singulation.

Although the present invention has been described above with reference to a specific embodiment, it will be understood that the invention is not limited by the particularities of the specific embodiment. Numerous variations, modifications and developments may be made in the above-described embodiments, with the scope of the invention being defined by the appended claims.

For example, although the embodiment described above involves manufacture of an interposer product configured to mount components on one side (the top in the drawings), the interposer product may be configured to mount components on both of its sides (i.e. on the top and on the bottom in the drawings).

Figure 5:
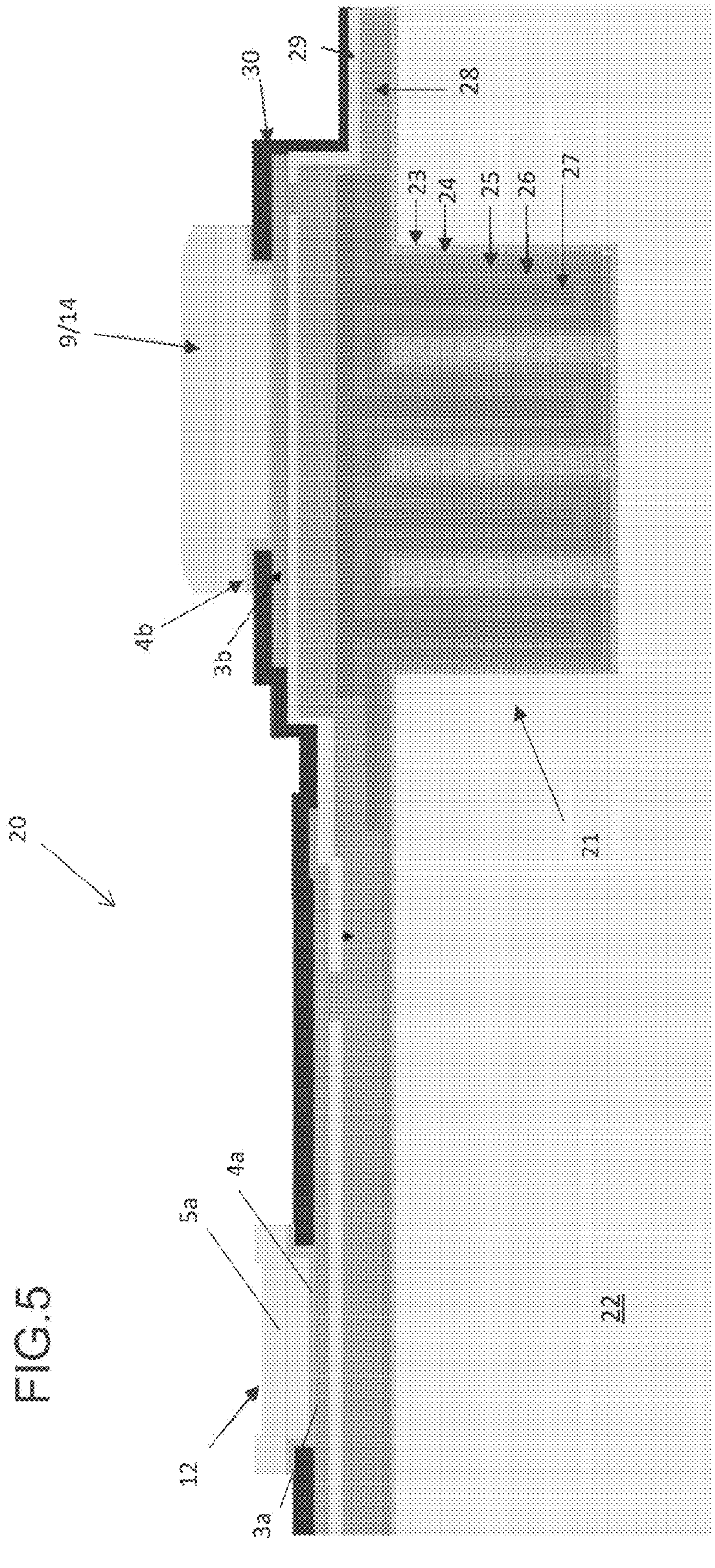
FIG. 5 is a cross-sectional view through an example of an interposer product having a 3D capacitor as well as a wire-bonding electrode and a bonding bump formed by a method embodying the invention.

As another example, although the embodiment described above involves manufacture of an interposer product configured to mount components on its surface, the substrate itself may additionally have one or more components embedded within it. FIG. 5 illustrates an example of an interposer product 20 having a substrate 22 that incorporates a three-dimensional capacitor 21 as well as having a wire-bonding electrode 12 and a bonding bump 14 made by a method including steps S100 to S105 of FIG. 2. In the interposer product 20 of FIG. 5, the 3D capacitor 21 is a so-called MIMIM capacitor, having three electrodes (conductive layers, M) and two dielectric layers (insulator layers, I) which form a capacitive stack. In variants, the capacitive stack may have fewer layers (e.g. it may be a MIM structure) or may have more layers (e.g. there may be additional pairs of MI layers added).

The stack of electrode layers and dielectric layers of the 3D capacitor 21 are provided in wells (holes, trenches) formed in a region of the substrate 22. The layers in the capacitive stack follow the contours of the underlying wells substantially conformally. The capacitive stack includes a first electrode layer 23 made of conductive material (e.g. doped Si), a first dielectric layer 24 made of insulating material (e.g. one or more dielectric layers) formed on the first electrode layer 23, a second electrode layer 25 made of conductive material (e.g. polysilicon) formed on the first dielectric layer, a second dielectric layer 26 made of an insulating material (e.g. one or more dielectric layers) formed on the second electrode layer 25, and a third electrode 26 made of conductive material (e.g. polysilicon) formed on the second dielectric layer. Additional insulating and conductive layers are provided to define selected contact regions. In this example, a first insulating layer 28 is provided, e.g. a layer of $SiO_2$, a second insulating layer 29 is provided, and a third insulating layer 30 is provided, e.g. made of nitride. FIG. 5 shows the locations of Al pads 3*a*, 3*b*, as well as seed layers 4*a*, 4*b*, portion 5*a* of the first gold layer forming wire-bonding electrode 12, and flat bonding bump 9 produced according to the method of FIG. 2. In this example, globally the flat bonding bump 9 is made of eutectic Au—Sn, planarized.

The invention claimed is:

1. A method of manufacturing an interposer product, the method comprising:

forming on a same side of an interposer substrate, by a common process, first and second portions of a gold layer, wherein the first portion of the gold layer constitutes a wire-bonding pad;

depositing a Au—Sn solder on the second portion of the gold layer, the Au—Sn solder comprising a gold-tin alloy having a first composition;

merging the deposited Au—Sn solder with the second portion of the gold layer by performing a reflow process to form at least one bonding bump, wherein a majority of the bonding bump is made of a eutectic composition of the gold-tin alloy, and wherein said first composition comprises a smaller proportion of gold than is in the eutectic composition of the gold-tin alloy; and planarizing the bonding bump to form a flat bonding bump having a selected height.

2. The interposer-product manufacturing method of claim 1, wherein the depositing of the Au—Sn solder comprises depositing of a Au—Sn solder paste comprising a gold-tin alloy in a chemical flux vehicle and, during the reflow process, the chemical flux removes an oxidation layer.

3. The interposer-product manufacturing method of claim 2, wherein the Au—Sn solder paste is deposited by a screen printing process.

4. A method of manufacturing an optical interposer product, said method comprising the interposer-product manufacturing method according to claim 2, wherein the step of planarizing the bonding bump comprises setting said selected height of the flat bonding bump dependent upon a target height above said interposer substrate of an optical component to be bonded to said flat bonding bump.

5. The method of manufacturing an optical interposer product according to claim 4, wherein said optical component is a laser diode.

6. The interposer-product manufacturing method of claim 1, further comprising:

forming, on a surface of the interposer substrate, respective adhesion/barrier layer portions upon which the first and second portions of the gold layer are formed.

7. The interposer-product manufacturing method of claim 6, wherein the adhesion/barrier layer portions are made of TiW.

8. The interposer-product manufacturing method of claim 7, further comprising forming, on a surface of the adhesion/barrier layer portions, a seed layer made of gold.

9. The interposer-product manufacturing method of claim 8, wherein the seed layer and the adhesion/barrier layer portions are deposited by sputtering.

10. The interposer-product manufacturing method of claim 1, wherein the interposer substrate is a silicon substrate.

11. The interposer-product manufacturing method of claim 1, wherein a batch of interposer products are made simultaneously on a substrate constituted by a silicon wafer, and the method comprises a singulation process to separate the individual interposer products.

* * * * *